United States Patent [19]

Miura

[11] Patent Number: 4,621,278

[45] Date of Patent: Nov. 4, 1986

[54] COMPOSITE FILM, SEMICONDUCTOR DEVICE EMPLOYING THE SAME AND METHOD OF MANUFACTURING

[75] Inventor: Norio Miura, Oota, Japan

[73] Assignees: Sanyo Electric Co., Ltd.; Tokyo Sanyo Electric Co., Ltd., both of Japan

[21] Appl. No.: 738,973

[22] Filed: May 29, 1985

Related U.S. Application Data

[63] Continuation of Ser. No. 335,658, Dec. 30, 1981, abandoned.

[51] Int. Cl.[4] .................. H01L 23/40; H01L 23/12; H01L 23/14
[52] U.S. Cl. ................................ 357/70; 357/71; 357/80
[58] Field of Search ................. 357/70, 71, 80, 68; 174/68.5; 361/42.1

[56] References Cited

U.S. PATENT DOCUMENTS

| | | | |
|---|---|---|---|
| 3,763,404 | 10/1973 | Aird ........................... | 357/70 |
| 3,768,986 | 10/1973 | Ramos et al. .............. | 174/52 FP |
| 3,838,984 | 1/1974 | Crane et al. ................ | 357/80 |
| 4,132,856 | 1/1979 | Hutchison et al. ......... | 357/70 |
| 4,191,800 | 3/1980 | Holtzman ................... | 174/68.5 |
| 4,353,954 | 10/1982 | Yomouka et al. .......... | 174/68.5 |

Primary Examiner—Andrew J. James
Assistant Examiner—S. V. Clark
Attorney, Agent, or Firm—Darby & Darby

[57] ABSTRACT

A composite film comprises two copper films (11, 12) adhered to and insulated from each other by a thermal setting resin (13) to be shaped in a belt shape. A lead frame is formed by etching one copper film of the composite film such that a plurality of lead patterns (15) are in succession defined including a plurality of leads (16) arranged approximately equispaced to extend in the length direction and the other copper film of the composite film is etched to form supporting patterns (19) corresponding to the respective lead patterns and for supporting the corresponding ones. A semiconductor element (20) is provided in association with the respective lead patterns and the semiconductor element is connected to the respective leads of the corresponding lead patterns by wire bonding, while the respective leads are connected to external terminals (22). The semiconductor element, the lead patterns and a portion of the external terminals are molded with a resin material so that a mold layer (23) is formed and then the composite film is severed for each of the mold layers, whereby a semiconductor device is provided.

20 Claims, 26 Drawing Figures

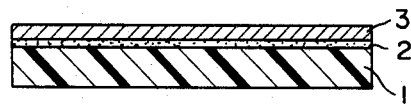
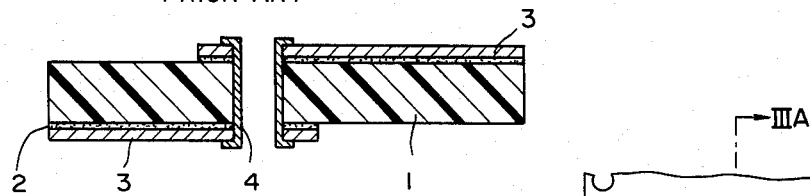
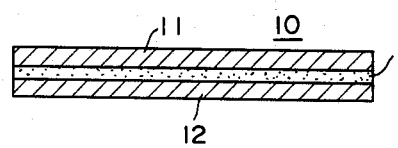
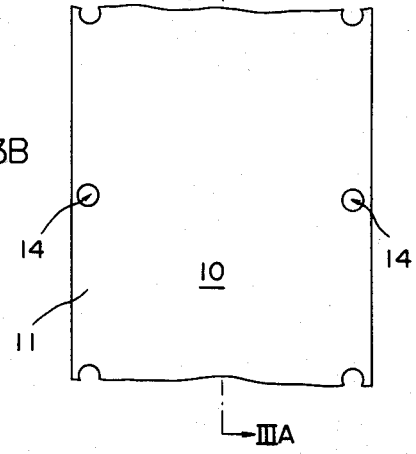
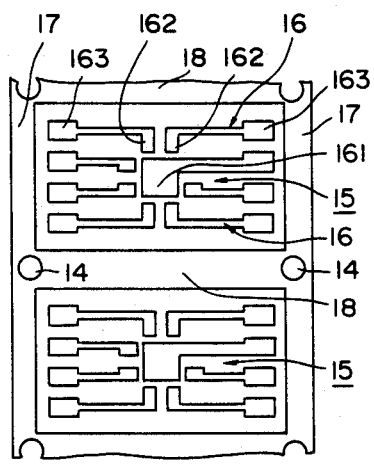
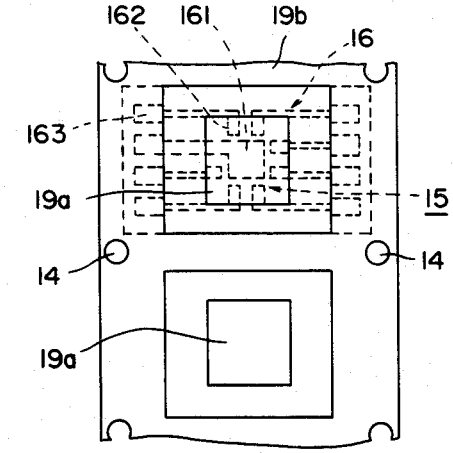

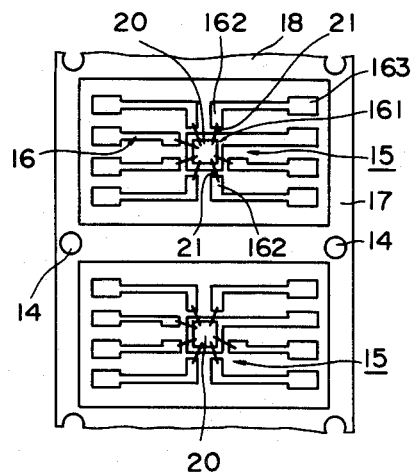
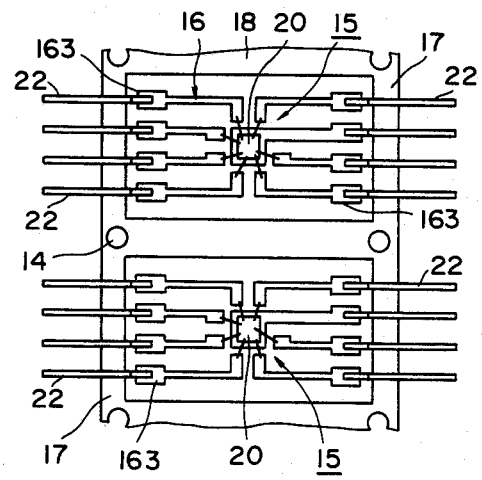
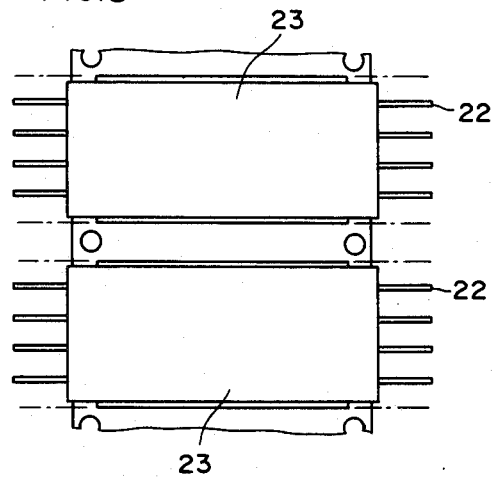
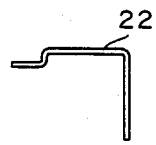
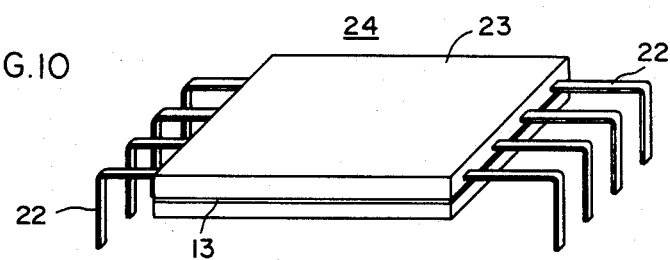

COMPOSITE FILM, SEMICONDUCTOR DEVICE EMPLOYING THE SAME AND METHOD OF MANUFACTURING

This is a continuation, of application Ser. No. 335,658, filed Dec. 30, 1981, now abandoned.

BACKGROUND OF THE INVENTION

1. Field of the Invention

The present invention relates to a composite film, a semiconductor device employing the same and a method of manufacturing the same. More specifically, the present invention relates to a semiconductor device fabricated by applying a so-called film carrier system by utilizing a novel composite film and a method of manufacturing the same.

2. Description of the Prior Art

A conventional method of semiconductor devices on a mass production basis employed a lead frame obtained by pressing a metallic flake. However, a conventional lead frame thus pressed made it impossible to supply such lead frame in a continuous or endless manner. Therefore, U.S. Pat. No. 3,689,991 was proposed which constitutes the background of the present invention. The referenced United States patent employs a flexible film carrier as shown in FIG. 1. Such flexible film is formed by adhering a copper film 3 onto a heat resistant plastic layer 1 of such as polyimide, polyamideimide or mailer with an adhesive agent 2. Such flexible film is transferred in succession in the longitudinal direction and lead patterns each having a plurality of leads are formed, thereby to provide flexible lead frames. By employing a flexible film as shown in FIG. 1, semiconductor devices can be manufactured with higher efficiency on a mass production basis as compared with conventional employment of lead frames made of metallic flakes as punched.

However, such conventional method of manufacturing semiconductor devices utilizing a flexible film employing such conventional heat resistant plastic has not yet become popular. The reason is that organic resin such as polyimide used as a plastic layer 1 for supporting the copper films 3 is so expensive that it costs as high as approximately 50 dollars per 1 m². In addition, even in the case where multilayer circuiting is made using such films, problems are involved. More specifically, since resin such as polyimide forming the above described plastic layer 1 has expansibility/compressibility, it becomes difficult to form pass through holes passing therethrough. Even if such pass through holes are formed, it was necessary to apply through hole plating 4 for the purpose of connecting the copper films 3 and 3 on both surfaces, as shown in FIG. 2. The reason is that the diameter of each pass through hole is susceptible of change due to expansibility/compressibility of the plastic layer 1.

On the other hand, conventionally hybrid integrated circuits have been fixed on a board made of alminum, for example. A conventional approach of employing such alminum board is of poor convenience of operation. Accordingly, another approach of utilizing such a film carrier as shown in FIG. 1 could be thought of. However, a conventional film carrier is expensive as described above and thermal conductivity of polyimide for example is poor, so that the advantage of hybrid integrated circuits that heat dissipation is good is degraded. As a result, it was impossible to utilize such conventional film carrier as shown in FIG. 1 in manufacture of hybrid integrated circuits.

SUMMARY OF THE INVENTION

A composite film in accordance with the present invention comprises a first and second conductive films adhered to each other with an adhesive agent of such as thermal setting resin so that both are electrically insulated from each other. The first conductive film of the composite film is utilized for formation of a lead pattern and the second conductive film is utilized for supporting the lead pattern thus formed. Thus a film lead frame applicable to a film carrier system is provided.

According to the present invention, a flexible composite film is provided with simplicity by merely adhering conductive films to each other. An adhesive layer for adhering the two conductive films is formed to a thickness of say 20 to 100 $\mu$m and accordingly the two conductive films can provide a withstand voltage of approximately 600 V at the least and approximately 2500 V on the average. Therefore, the inventive composite film can be advantageously utilized in manufacture of semiconductor devices and other electronic components by applying a so-called film carrier system.

Since the inventive film lead frame is structured such that a lead pattern formed by one conductive film is supported by the other conductive film, utilization of the other conductive film makes it possible to implement multilayered connection with ease. In addition, conventional through hole plating can be dispensed with even in the case where leads formed with one conductive film and leads formed with the other conductive film are electrically connected to each other. For example, a through hole can be formed with ease by pricking with a needle having a sharp tip end a portion of the composite film where the lead formed with one conductive film and the lead formed with the other conductive film are overlapped. In addition, the lead formed with one conductive film is deformed by piercing of such needle to come in contact with the lead formed with the other conductive film. Therefore, two leads can be electrically connected with ease by simply filling thereafter a solder or a conductive paste in the passing through hole. The fact that the adhesive layer is extremely thin leads to facility of through hole connection.

Utilization of such composite film as described above enables mass production of semiconductor devices with ease and efficiency. Lead patterns each having a plurality of leads are formed by etching one conductive film of the thus prepared composite film. A semiconductor element is fixed in association with the lead pattern and the respective leads of the corresponding lead pattern are electrically connected to the semiconductor element. The respective leads of the lead pattern are connected to external terminals. Thereafter at least the semiconductor element, the lead pattern and a portion of the external terminals are molded for each lead pattern, whereby a mold layer is formed. Then finally the composite film is severed for each mold layer, whereby each semiconductor apparatus is separated. Thus semiconductor devices can be manufactured on a mass production basis in accordance with a so-called film carrier system by utilizing a novel composite film comprising two conductive films adhered to each other. Since no heat resistive plastic such as polyimide of an expensive cost is utilized in such composite film, semiconductor devices per se can also be provided with a less expensive costs.

The composite film is formed in a belt shape and is continually transferred and the above described successive steps are carried out while the composite film is continually transferred. By doing so, the respective steps can be performed while the composite film is transferred in a film state until the final step of molding and thus a method of manufacturing semiconductor devices can be established by a film carrier system.

In forming lead patterns with one conductive film, a plurality of leads included in each of the lead patterns are formed with these electrically separated. Since the respective leads are electrically independent of each other, a circuit function of a semiconductor element as fixed can be tested in the film state, i.e. without carrying out any step for electrically isolating the respective leads. Since a circuit function of the semiconductor element can be thus tested with ease in the course of the manufacturing process, a yield rate of the completed products can be considerably enhanced.

In forming a film lead frame by utilizing a composite film of a belt form, a reinforcing portion for reinforcing the mechanical strength of the film is formed separately from the lead pattern by the use of one conductive film. Such reinforcing portion extends in the length direction of the composite film of the belt shape. Accordingly, when semiconductor devices and other electronic components are manufactured in accordance with a film carrier system, a lead pattern can be protected from been destroyed by the force being exerted while the film lead frame is transferred by means of the index holes.

A support pattern is formed for supporting the respective lead patterns by the use of the other conductive film of the composite film. A metallic piece fixing pattern may be formed for fixing a metallic piece by the use of the other conductive film separately from the above described support pattern. The metallic piece is fixed onto the fixing pattern and thereafter the adhesive agent or thermal setting resin at the position corresponding to the metallic piece is removed. A semiconductor element is fixed onto the metallic piece on one conductive film surface. The embodiment thus utilizing a metallic piece for fixing a semiconductor element enables such metallic piece to function as a portion for placement of a semiconductor element and also to function as a heat sink, thereby to provide preferred heat dissipation. Accordingly, the embodiment in discussion can be advantageously utilized in manufacture of hybrid integrated circuits.

Accordingly, a principal object of the present invention is to provide a novel composite film.

Another object of the present invention is to provide a semiconductor device utilizing such novel composite film.

A further object of the present invention is to provide a method for manufacturing a semiconductor device with high efficiency by the use of a novel composite film as a lead frame of a film carrier system.

One aspect of the present invention resides in a composite film comprising two conductive films adhered to each other through an adhesive layer.

Another aspect of the present invention resides in a film lead frame wherein a lead frame is formed using one conductive film of the above described composite film and a supporting member for supporting the lead frame is formed by the use of the other conductive film of the above described composite film.

A further aspect of the present invention resides in a method for manufacturing a semiconductor device by applying a so-called film carrier system by using such film lead frame.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view showing one example of a flexible film applicable to a conventional film carrier which constitutes the background of the present invention;

FIG. 2 is a sectional view showing one example of multilayered circuiting by the use of such conventional flexible film;

FIGS. 3A and 3B show one example of a composite film in accordance with the present invention, wherein FIG. 3A is a sectional view taken along the line IIIA—IIIA in FIG. 3B and FIG. 3B is a plan view of the FIG. 3A;

FIGS. 4 to 10 are views showing in sequence the respective steps for manufacturing a semiconductor device by the use of a novel composite film in accordance with the present invention;

DESCRIPTION OF THE PREFERRED EMBODIMENTS

Figure 11:
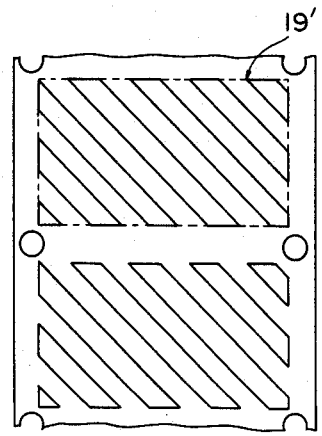
FIG. 11 is a view showing another example of a supporting pattern.

FIGS. 3A and 3B are views showing one example of a composite film in accordance with the present invention, wherein FIG. 3A is a sectional view taken along the line IIIA—IIIA in FIG. 3B. A composite film 10 comprises two conductive films or copper films 11 and 12 adhered to each other with an adhesive agent 13, as shown in FIGS. 3A and 3B. The embodiment shown is formed with two copper films 11 and 12 each of which is that which is usually used for a printed circuit board having a thickness of approximately 35 $\mu$m. An adhesive agent 13 of thermal setting resin such as epoxy resin is coated on the whole surface of one or both of the copper films 11 and 12 and then both films are adhered to each other and then the composite thus obtained is compressed by means of, for example, a roller, not shown, so that the two copper films 11 and 12 may be unitary with the adhesive agent 13 sandwiched therebetween, thereby to provide a composite film 10. Thermal setting resin for that purpose may be that described in Japanese Patent Publication No. 20394/1980 published for opposition June 2, 1980. The referenced Japanese patent publication gazette discloses phenol resin, melamine resin or epoxy resin as thermal setting resin. The thickness of the adhesive agent layer 13 is selected to be 20 to 100 μm. The lower limit of the thickness of the adhesive agent layer 13 is determined by the withstand voltage between the two copper films 11 and 12 and the upper limit is determined depending upon whether a passing through hole for passing through of the adhesive agent layer 13 can be simply formed when the two copper films are to be connected by way of through hole connection in multilayered connection to be described subsequently. Assuming that the thickness of the adhesive agent layer 13 is selected to be say 30 μm in the above described range, a withstand voltage between the two copper films 11 and 12 would become at least 600 V and on the average more than 2500 V.

Such composite film is shaped to be in a belt shaped film by cutting the same into a predetermined width, say approximately 5 cm, required for products to be manufactured using the same. Such composite film of such belt shape is then cut to a predetermined unit length such as 50 m and is wound on a reel, not shown. Since the adhesive agent layer 13 is extremely thin, care must be taken that the two copper films 11 and 12 may not be short circuited on the cutting end surface when the composite film is pressed. Meanwhile, such thin thickness of the adhesive agent layer 13 is effective in through hole connection of multilayered wiring, as to be described subsequently. The composite film of a belt shape is provided with index holes 14, 14, . . . at equispaced intervals at both end portions where no lead patterns to be described subsequently are provided, as shown in FIG. 3B. The index holes 14, 14, . . . are formed by punching, for example, and the same may be used for the purpose of positioning and for the purpose of transferring of the composite film in the subsequent manufacturing steps. Thus, the inventive composite film eliminates necessity of employing such expensive adhesive agent as polyimide conventionally employed and is provided by simply adhering the two conductive films with an adhesive agent, with the result that the same is provided with an extremely inexpensive cost. Such composite film can be advantageously utilized in manufacturing electronic components such as semiconductor devices in accordance with a so-called film carrier system.

Now referring to FIGS. 4 to 10, the respective steps of manufacturing a semiconductor device by the use of such novel composite film will be described in the following. Meanwhile, the embodiment utilizes a so-called film carrier system and fundamentally employs an approach disclosed in the previously referenced U.S. Pat. No. 3,689,991.

First, a composite film 10 in a belt shape as shown in FIGS. 3A and 3B is prepared. One copper film 11 of the composite film 10 is selectively etched, whereby a lead pattern 15 as shown in FIG. 4 is formed on one surface of the composite film. The lead pattern 15 comprises a plurality of leads 16, which are electrically independent of each other. A series pattern 17 including a series of index apertures 14 disposed in the longitudinal direction is formed at each of both ends on one surface of the composite film of a belt shape. The series pattern 17 is formed to protect the lead pattern 15 from being deformed by the force exerted when the composite film 10 is transferred by utilizing the index apertures 14. Accordingly, in order to increase protection of such lead pattern, connecting patterns 18 for connecting the series patterns 17 and 17 at both ends are formed as shown in FIG. 4. Thus, the lead pattern 15 is completely surrounded by the series patterns 17 and the connecting patterns 18. The respective leads 16 of the lead pattern 15 are electrically independent of such series patterns 17 and the connecting patterns 18.

Specifically, the lead pattern 15 comprises a fixing pad 161 for placement thereon of a semiconductor element, to be described subsequently, at an approximate central portion. The respective leads 16 are disposed in a dual in-line fashion. The leads 16 each comprise at one end thereof a connecting electrode 162 for wire bonding connection of a bonding wire to be connected to the semiconductor element. The other end of each of the leads 16 has a connecting electrode 163 for connection of an external terminal, not shown. Such lead patterns 15 are continually formed in succession in the longitudinal direction at predetermined intervals and in the same pattern as the composite film is continually transferred from a reel on which the composite film is wound, as shown in the previously referenced United States patent. The index apertures 14 function as an index for positioning thereof. Thus, such composite film can be utilized in a film carrier system. Since such lead patterns 15, the series patterns 17 and the connecting patterns 18 can be formed by etching, no force is undesirably exerted onto the composite film in forming such patterns and accordingly the thin adhesive agent layer 13 (FIG. 3A) is not broken and hence one copper film, i.e. the above described respective patterns are not short circuited to the other copper film 12.

The other copper film 12 of the composite film 10 is etched as shown in FIG. 5. More specifically, supporting patterns 19a and 19b are formed on the other surface of the composite film by removing a portion of the copper film 12 by etching the same in a doughnut shape. More specifically, the supporting patterns 19a and 19b are formed by etching the other copper film 12 leaving a portion corresponding to the fixing pad 161 and the connecting electrodes 162 and 163 and a portion corresponding to the series patterns 17 and the connecting patterns 18 formed on one surface of the composite film. Meanwhile, the shape of these supporting patterns 19a and 19b is determined depending on the shape of the lead patterns formed on one surface of the composite film and the portion where the semiconductor element or other chip like components and external terminals are to be connected and the portion where bonding wires are to be connected need be left in the other copper film. Accordingly, in the case where the composite film is employed in a low frequency circuit where no problem arises in conjunction with parasitic capacitance between both surfaces, the whole surface of the other copper film 12 can be utilized as a supporting pattern for supporting the lead patterns, thereby to protect the same from being deformed. In such case, the tensile strength of each of the leads of each of the lead patterns 15 formed on one surface of the composite film may be considered as exactly the same as that in the case of one continuous copper film, inasmuch as the respective leads are adhered to the other copper film 12 on the whole surface through the adhesive agent layer 13. Meanwhile, in the case where the other copper film 12 is totally utilized as a supporting pattern, the above described parasitic capacitance occurs and therefore the same might not be suited for a high frequency circuit. Therefore, in order to avoid it, a supporting pattern as shown in FIG. 5 may be formed, so that the other copper film 12 may be left only in a required portion.

Meanwhile, the above described etching of the copper films 11 and 12 of the composite film are carried out simultaneously. More specifically, a resist film is screen processed on each of the copper films 11 and 12 of the composite film such that the resist film may be in the shape corresponding to the lead patterns 15, the series patterns 17 and the connecting patterns 18 as shown in FIG. 4 on one copper film 11 of the composite film and the resist film may be in the shape corresponding to the supporting patterns 19a and 19b as shown in FIG. 5 on the copper film 12 of the composite film. Thereafter the composite film is transferred continuously into an etching apparatus capable of etching simultaneously both surfaces thereof, such that an etchant is jetted onto each of both surfaces of the composite film by nozzles facing each other. Thus, the patterns shown in FIGS. 4 and 5 are thus simultaneously formed on both surfaces of the composite film. For the purpose of simultaneous formation of such patterns on both surfaces, two conductive films can be preferably etched by the same etchant. However, alternatively, one conductive film may be formed with say copper of good conductivity and the other conductive film may be formed with say aluminum so that the composite film may be etched with different etchants.

The composite film with the lead patterns 15 and the supporting patterns 19 formed as described above is wound on a reel, not shown, and is stocked. Then the composite film is supplied from the reel to the subsequent steps in a frame-byframe fashion, i.e. intermittently by the use of the index apertures 14.

At the next step a semiconductor element 20 is fixed or die bonded onto the fixing pad 161 by the use of a silver paste or solder, as shown in FIG. 6. Then, by using a well-known automatic bonding machine, the electrodes, not shown, of the semiconductor element 20 are connected to connecting electrodes 162 of the corresponding leads by means of bonding wires 21. Since the embodiment shown is structured such that the respective leads 16 included in the lead pattern 15 are formed to be electrically independent of each other, a function of the circuit including the semiconductor element 20 can be tested at that time. More specifically, test is made to check whether the circuit of the semiconductor element 20 properly functions by applying electricity by sticking a testing needle, for example, to the connecting electrodes 163 of the respective leads 16 included in the lead pattern 15. Functional trimming may be made at that time, as necessary. In the case where not only the semiconductor element 20 but also other circuit elements have been mounted onto the lead pattern 15, the function of the whole circuit including all these elements can be tested, as a matter of course. If it is determined by the above described function test that a prescribed function is not performed, then the semiconductor element 20 is replaced by a proper one or the above described defective semiconductor element is marked so that the said element may not be subjected to further steps, with the result that the yield rate of the completed products is enhanced. If it is determined at that test that the element performs normal operation, then the composite is coated with silicone resin, so that the semiconductor element 20 and other circuit elements, if any, and bonding wires may be protected.

Then, as shown in FIG. 7, with the film of the belt shape maintained, the connecting electrodes 163 of the respective leads 16 included in the lead pattern 15 are connected to the external terminals 22 by soldering. At that time, the respective external terminals 22 are bent, as shown in FIG. 8, so that the same may not be short circuited to the series pattern 17 formed at both ends on one surface of the composite film.

Then, as shown in FIG. 9, mold layers 23, 23, ... are formed. More specifically, following the step shown in FIG. 7, the mold layers 23 are formed one by one or plural by plural, while the composite film is in succession transferred. In forming the mold layers 23, epoxy resin of powder is sprayed and heated to be set or solidified. The mold layers 23 are formed on the whole, while a portion of each of the external terminals 22 is left exposed. Following the step shown in FIG. 9, the composite film is severed at the portion shown by one dotted line in FIG. 9, whereby separate semiconductor devices 24 as shown in FIG. 10 are provided. Thus, semiconductor devices can be manufactured with high efficiency by utilizing the inventive composite film and by applying the so-called film carrier system.

It is needless to say that the present invention can be applied not only to semiconductor devices but also to general electronic components. In such case, the lead pattern is changed depending on the components and electronic components of a chip shape are fixed in place of semiconductor elements.

Furthermore, as described in the foregoing, one copper film of the composite film is utilized for forming a supporting pattern. Accordingly, in order to increase the strength the thickness of the conductive film forming the supporting pattern may be increased as compared with the conductive film for forming the lead pattern.

FIG. 11 is a view showing another example of such supporting pattern. In the FIG. 11 example the other copper film 12 is etched and an oblique stripe supporting pattern 19' is provided. Such supporting pattern may be properly determined so as to correspond to the shape of the lead pattern as described previously. A point is that the shape of the lead pattern need be maintained so that the same may be destroyed during execution of the above described steps. However, since the embodiment shown is structured such that the respective leads included in the lead pattern are independent of the others, such supporting pattern need be formed to be at least partially overlapped to the respective leads. The reason is that it is difficult to maintain the lead pattern only with the adhesive agent layer 13 (FIG. 3A).

Figure 12:
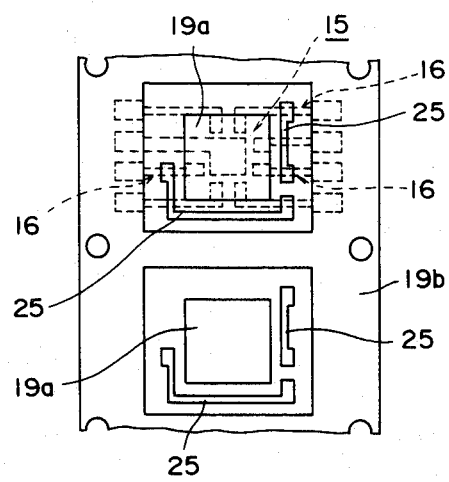
FIGS. 12 and 13 are views showing one example of a multilayered wiring connection by the use of a novel composite film.
Figure 13:
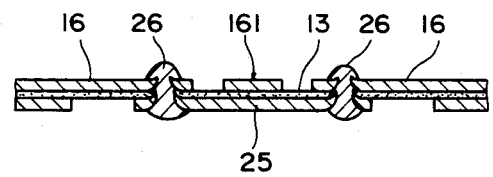

FIG. 12 is a view showing a further embodiment of the present invention. The embodiment shown is structured such that not only the supporting patterns 19a and 19b but also the connecting leads 25 are formed by the use of the other copper film 12 of the composite film. Thus, a multilayered connection can be performed by using the inventive composite film. The connecting leads 25 are connected to predetermined ones of the leads 16 included in the lead pattern 15 formed on one surface of the composite film by through hole connection, as shown in FIG. 13. More specifically, a passing through hole is formed at the portion where the lead 16 of one surface and the connecting lead 25 of the other surface of the composite film are overlapped and a conductive material 26 of such as solder is poured into the passing through hole, whereby the lead 16 and the connecting lead 25 are connected. Thus, multilayered connection is achieved.

Figure 14A:
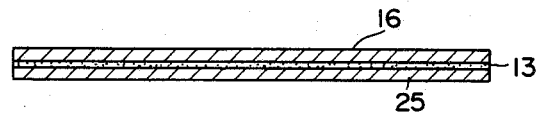
FIGS. 14A to 14C are views showing in sequence the respective steps for performing such multilayered wiring connection.
Figure 14B:
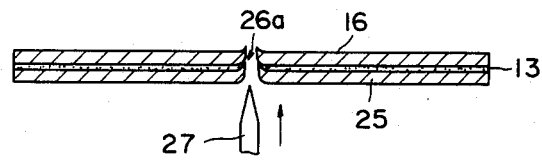
Figure 14C:
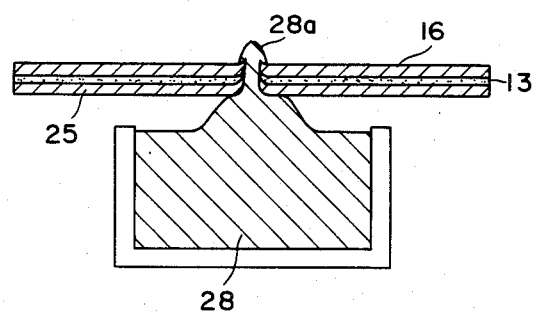
Figure 15A:
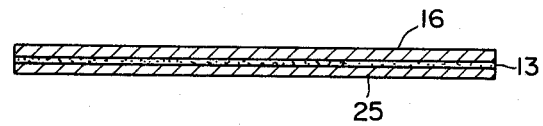
FIGS. 15A to 15C are views showing in sequence the respective steps of another example for performing such multilayered wiring connection.
Figure 15B:
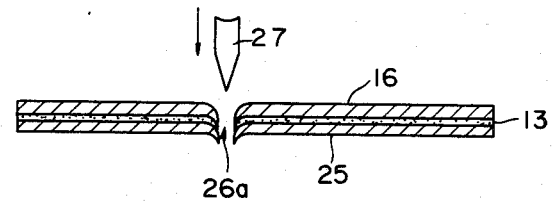
Figure 15C:
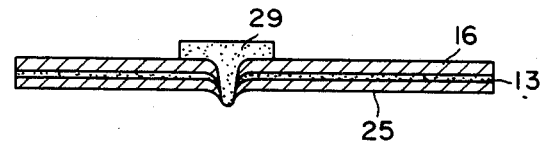

Such multilayered connection can be achieved by a process shown in FIGS. 14A to 14C or in FIGS. 15A to 15C, for example.

According to the example shown in FIGS. 14A to 14C, first a passing through hole 26 penetrating the connecting lead 25 formed as described above and the lead 16 included in the lead pattern is formed. The passing through hole 26 is formed by piercing a sharp metallic needle 27 of approximately 1 mm at the tip end through the composite film or the film lead frame from the connection lead 25 to reach the lead 16. Since the adhesive agent layer 13 is as thin as approximately 30 μm, the adhesive agent layer 13 can be pierced with ease with the metallic needle 27, as is different from conventional polyimide. When the metallic needle 27 is pierced therethrough, the needle comes to be in contact with the lead 16 with the rear surface lead 25 deformed. Thereafter, as shown in FIG. 14C, the composite film or the film lead frame having the passing through apertures 26a thus formed is allowed to pass by on a jet stream solder tank 28. Accordingly, the solder 28a reserved in the solder tank 28 flows into the passing through holes 26a as a function of surface tension. Since the adhesive agent layer 13 is extremely thin, through hole connection of the multilayered connection can be performed with ease at this step. Although solder is fixed to the copper films remaining on the other surface of the composite film or the film lead frame, the remaining copper film is the supporting pattern and any solder fixed onto such supporting pattern does not adversely affect the performance of the completed products nor cause any inconvenience at the further manufacturing steps.

In the case shown in FIGS. 15A to 15C, the metallic needle 27 is pierced from the lead 16. Accordingly, as the metallic needle 27 is inserted, the lead 16 comes in contact with the connecting lead 24. Thereafter, as shown in FIG. 15C, a conductive paste 29 of such as a silver paste or a solder cream is screen processed on the passing through hole 26a thus formed. As a result, the passing through hole 26a is filled with the conductive paste 29. The conductive paste 29 thus filled is then heat treated. Accordingly, a solvent included in the conductive paste is dispersed and as a result the lead 16 and the connecting lead 25 are more fully connected electrically. Screen processing of the conductive paste 29 can be simultaneously performed with the screen processing of the conductive paste to be performed on the occasion of fixing a circuit element such as a semiconductor element onto the lead pattern. Accordingly, any particular step for forming the conductive paste 29 can be dispensed with and through hole connection of multilayered wiring can be performed with efficiency.

Figure 16:
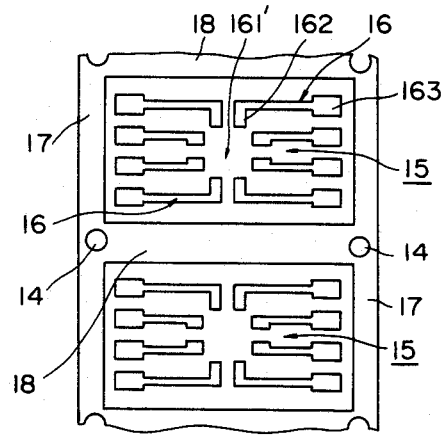
FIGS. 16 to 19 are views showing in sequence the respective steps of a further example for manufacturing a semiconductor device by the use of a novel composite film.
Figure 17:
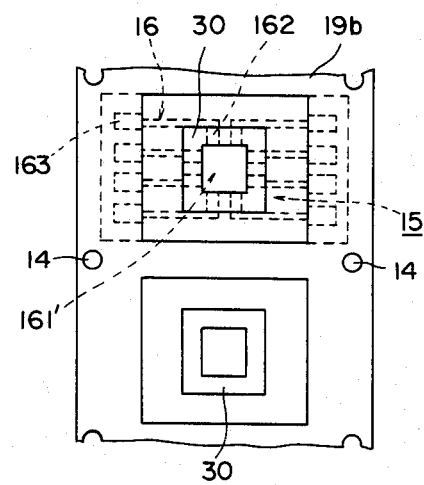

FIGS. 16 to 19 are views showing in sequence the manufacturing process of a further embodiment of the present invention. The previously described embodiment was formed with the fixing pad 161 (FIG. 4) for fixing a semiconductor element. By contrast, the embodiment in discussion employs a metallic piece for fixing a semiconductor element. Accordingly, as shown in FIG. 16, the lead pattern 15 has no fixing pad formed. Instead, the lead pattern 15 has a vacant region 161' at an approximate central portion for disposing a semiconductor element. Then, as shown in FIG. 17, a supporting pattern 19b and a pattern 30 to be utilized for fixing the metallic piece are formed by using the other copper film 12 of the composite film. The pattern 30 also functions to support the lead pattern 15 formed on one surface of the composite film together with the supporting pattern 19b.

Figure 18:
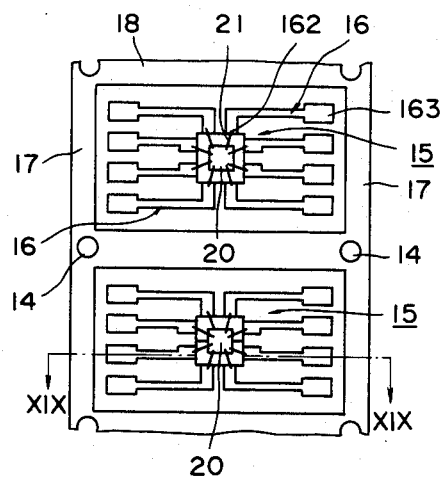
Figure 19:
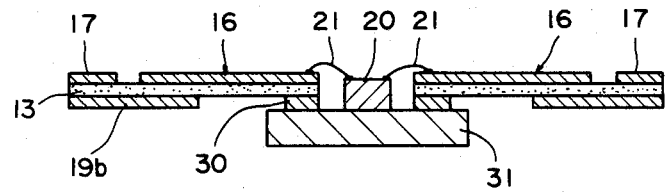

Then, as shown in FIGS. 18 and 19, the metallic piece 31 is fixed to the pattern 30 and then the semiconductor element 20 is fixed onto the metallic piece 31. More specifically, in the course of transfer of the composite film or the film lead frame, the metallic piece 31 made of copper, for example, is fixed onto the pattern 30 by solder, for example, as shown in FIG. 19. Then the adhesive agent layer existing above the metallic piece 31 is removed by a pincette, for example. Then the semiconductor element 20 is fixed onto the metallic piece 31 thus fixed by a silver paste or solder. Then the semiconductor element 20 thus fixed and the connecting electrodes 162 of the respective leads included in the corresponding lead pattern are connected by the bonding wires 21. Thereafter test is made and a resin mold layer is formed and composite films are severed to provide separate semiconductor devices, in the same manner as that of the previously described embodiments. Thus, according to the embodiment shown, since the semiconductor element 20 is fixed directly to the metallic piece 31, an excellent heat dissipating characteristic is achieved. Accordingly, the embodiment shown can be advantageously utilized in manufacturing semiconductor elements of a large exothermic amount such as hybrid integrated circuits. Furthermore, since the connecting electrodes 162 (FIG. 16) has been supported by the metallic piece 31 even on the occasion of wire bonding between the semiconductor element and the leads, bonding can be performed better in a very stable state. In addition, in forming the mold layer 24 (FIG. 9), the metallic piece 31 may be covered wholly with the mold layer. However, if a larger heat dissipating amount is required, the surface opposite to that where the semiconductor element 20 of the metallic piece 31 is fixed may be left exposed from the mold layer. Since a conventional film carrier system utilized an insulating layer of poor thermal conductivity such as a polyimide, a semiconductor device of a large exothermic amount could not be fabricated by utilizing a film carrier system. However, since the embodiment shown was structured such that a metallic piece is employed and a semiconductor element is fixed directly onto the same, the embodiment shown makes it possible to manufacture with high efficiency semiconductor devices of a large exothermic amount.

Figure 20:
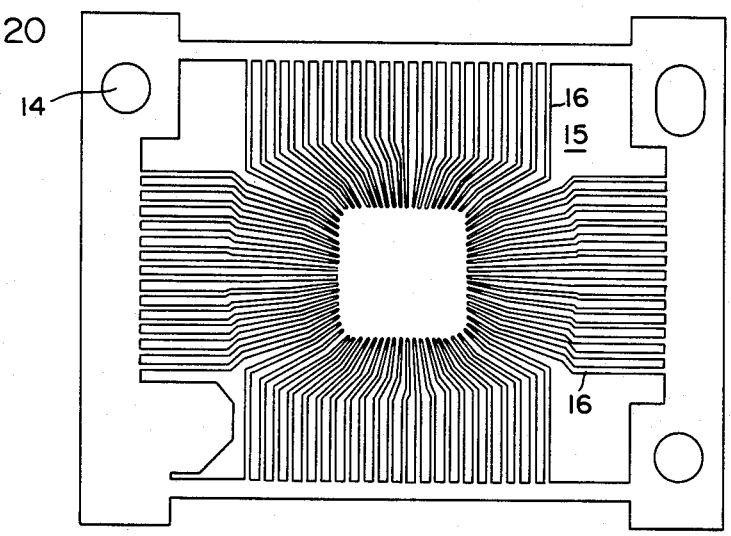
FIG. 20 is a view showing one example of a lead pattern, as actually practiced, on one surface of a film lead frame.
Figure 21:
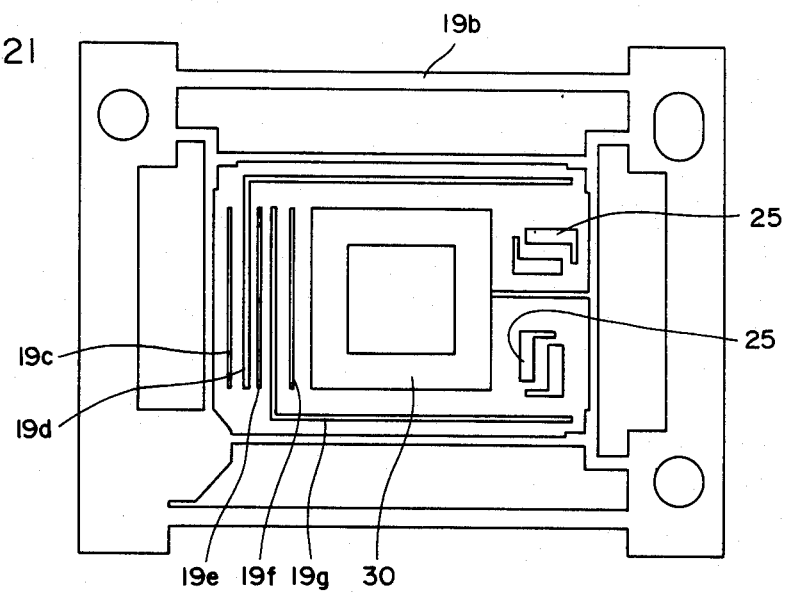
FIG. 21 is a view showing one example of a supporting pattern, as actually practiced, on the other surface of the FIG. 20 film lead frame.

FIGS. 20 and 21 are views showing actual examples of the lead pattern, the supporting pattern and the connecting leads manufactured in accordance with the embodiments shown in FIGS. 16 to 19. Thus, the inventive composite film is utilized in manufacture of semiconductor devices, for example. Referring to FIG. 20, the lead pattern 15 includes sixty-two leads 16. Referring to FIG. 21, the supporting patterns 19b to 19g are formed, the metallic piece fixing pattern 31 is formed and the connecting leads 25 for multilayered connection are formed. The geometry and disposal of the supporting patterns 19b to 19g have been selected such that the above described parasitic capacitance may be as small as possible while the lead pattern shown in FIG. 20 may be assuredly supported. Thus it is desired that the area of the supporting pattern may be minimized.

Although the present invention has been described and illustrated in detail, it is clearly understood that the same is by way of illustration and example only and is not to be taken by way of limitation, the spirit and scope of the present invention being limited only by the terms of the apended claims.

What is claimed is:

1. A film lead frame comprising
a composite film including at least two electrically conductive films pemmanently adhered to and electrically isolated from each other with only thermal setting resin, said resin having a thickness thinner than a thickness necessary for supporting said conductive films, said resin thickness being deleted to provide a breakdown voltage larger than a voltage applied to said conductive films,
a plurality of lead patterns each independently formed on one surface of said composite film with one of said conductive films, each said lead pattern including a plurality of leads, and
a supporting member formed on the other surface of said composite film with the other of said conductive films for supporting said lead pattern to form a substantially continuous conductive film.

2. A film lead frame in accordance with claim 1, wherein
said composite film is formed in a belt shape, and
said lead pattern includes the same patterns formed at equispaced intervals disposed in the longitudinal direction of said composite film.

3. A film lead frame in accordance with claim 1 wherein
said supporting member comprises a plurality of supporting patterns formed corresponding to the respective ones of said lead patterns.

4. A film lead frame in accordance with claim 3, which further comprises
areas in which said other conductive film has been removed; and
at least one connecting lead formed on the other durface of said composite film at a position where said other conducting film does not exist.

5. A film lead frame in accordance with claim 4, which further comprises
connecting means extending through said thermal setting resin for connecting said leads of said lead patterns and said connecting leads.

6. A film lead frame in accordance with claim 5, wherein said connecting means comprises
passing through holes formed at a position where said lead of said lead pattern and said connecting lead are disposed oppositely across said resin layer, and
a conductive material filed in said passing through hole.

7. A film lead frame in accordance with claim 1, wherein
said plurality of leads included in said lead pattern are formed to be electrically independent of each other.

8. A film lead frame in accordance with claim 7, wherein
said supporting member comprises a supporting pattern formed with the other conductive film so as to correspond to each one of said lead patterns.

9. A film lead frame in accordance with claim 8, wherein
said supporting pattern is formed so as to overlap at least a portion of the respective ones of said plurality of leads.

10. A film lead frame in accordance with claim 9, which further comprises
connecting leads formed on the other surface of said composite film with said other conductive film so as to be electrically independent from said supporting pattern and to be connected through said adhesive layer to any one of said leads of aaid lead pattern.

11. A film lead frame in accordance with claim 1, further comprising areas in which said other conductive film has been removed, thereby rendering said supporting member partially discontinuous, said removed areas underlying a portion of said lead pattern, and the unremoved areas also underlying a portion of said lead pattern, whereby the unremoved areas of said other conductive film cooperate with said lead patterns to support said composite film.

12. A film lead frame in accordance with claim 11, wherein
said composite film is formed in a belt shape, and
said lead pattern includes the same patterns formed at equispaced intervals disposed in the longitudinal direction of said composite film.

13. A film lead frame in accordance with claim 11, wherein
said supporting member comprises a plurality of supporting patterns formed corresponding to the respective ones of said lead patterns.

14. A film lead frame in accordance with claim 13, which further comprises at least one connecting lead formed on the other surface of said composite film at a position where said other conducting film does not exist.

15. A film frame in accordance with claim 14, whichcfurther comprises
connecting means extending through said thermal setting resin for connecting said leads of said lead patterns and said connecting leads.

16. A film lead frame in accordance with claim 15, wherein said connecting means comprises
through holes formed at the position where said lead of said lead pattern and said connecting lead are overlapped, and
a conductive material filled in said through hole.

17. A film lead frame in accordance with claim 11, wherein said plurality of leads included in said lead pattern are formed to be electrically independnet of each other.

18. A film lead frame in accordance with claim 17, wherein said supporting member comprises a supporting pattern formed with the other conductive film so as to correspond to each one of said lead patterns.

19. A film lead frame in accordance with claim 18, wherein said supporting pattern is formed so as to overlap at least a portion of the respective ones of said plurality of leads.

20. A film lead frame in accordacne with claim 19, which further comprises connecting leads formed on the other surface of said composite film with said other conductive film so as to be electrically independent from said supporting pattern and to be connected through said adhesive layer to any one of said leads of said lead pattern.

* * * * *